US008847213B2

United States Patent
So et al.

(10) Patent No.: US 8,847,213 B2
(45) Date of Patent: Sep. 30, 2014

(54) ORGANIC LIGHT-EMITTING DISPLAY APPARATUS AND METHOD OF MANUFACTURING THE SAME

(71) Applicant: Samsung Display Co., Ltd., Yongin (KR)

(72) Inventors: Dong-Yoon So, Yongin (KR); Ji-Eun Kim, Yongin (JP); Han-Soo Kim, Yongin (KR); Seon-Hee Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/649,420

(22) Filed: Oct. 11, 2012

(65) Prior Publication Data

US 2013/0313528 A1 Nov. 28, 2013

(30) Foreign Application Priority Data

May 22, 2012 (KR) ........................ 10-2012-0054456

(51) Int. Cl.
*H01L 35/24* (2006.01)
(52) U.S. Cl.
USPC ..................................... 257/40; 257/E51.001
(58) Field of Classification Search
CPC ............ H01L 51/0545; H01L 51/0036; H01L 51/5012; H01L 51/0541; B82Y 10/00
USPC ............................................. 257/40, E51.001
See application file for complete search history.

(56) References Cited

U.S. PATENT DOCUMENTS

| 7,965,497 B2 | 6/2011 | Kwon et al. |
| 8,154,198 B2 | 4/2012 | Lee et al. |
| 2010/0117067 A1 | 5/2010 | Sin et al. |
| 2011/0253709 A1 | 10/2011 | Kang et al. |

FOREIGN PATENT DOCUMENTS

| KR | 10-2010-0007630 | 1/2010 |
| KR | 10-2010-0047585 | 5/2010 |
| KR | 10-2010-0052895 | 5/2010 |
| KR | 10-2010-0086782 | 8/2010 |
| KR | 10-2011-0115450 | 10/2011 |

*Primary Examiner* — Anthony Ho
(74) *Attorney, Agent, or Firm* — Knobbe Martens Olson & Bear LLP

(57) ABSTRACT

An organic light-emitting display apparatus includes a substrate, a display disposed on the substrate, an opposite substrate disposed to face the substrate with the display therebetween, a seal disposed between the substrate and the opposite substrate to couple the substrate to the opposite substrate and arranged around an outer circumference of the display such that the display is located inside the seal, and a support disposed between the substrate and the opposite substrate and arranged around a corner of the seal so that the corner of the seal is located inside the support.

19 Claims, 6 Drawing Sheets

ORGANIC LIGHT-EMITTING DISPLAY APPARATUS AND METHOD OF MANUFACTURING THE SAME

CROSS-REFERENCE TO RELATED APPLICATIONS

This application claims the benefit of Korean Patent Application No. 10-2012-0054456, filed on May 22, 2012, in the Korean Intellectual Property Office, the disclosure of which is incorporated herein in its entirety by reference.

BACKGROUND

1. Field

The present disclosure relates to an organic light-emitting display apparatus which includes a support to improve a step of a seal and to protect an edge of a display unit from cracking, and a method of manufacturing the same.

2. Description of the Related Technology

Recently, display apparatuses have been replaced with portable thin flat panel display apparatuses. Among these flat panel display apparatuses, organic or inorganic light-emitting display apparatuses, which are self-emission display apparatuses, are getting attention due to their advantages: wide viewing angles, high contrast ratios, and high response speeds. An organic light-emitting display apparatus including an emission layer formed of an organic material generally has better brightness, driving voltage, and response speed characteristics than an inorganic light-emitting display apparatus, and embodies various colors.

SUMMARY OF CERTAIN INVENTIVE ASPECTS

Embodiments of the present invention provide an organic light-emitting display apparatus that includes a support to improve a step of a seal so as to prevent exfoliation and cutting defects which may occur when a corner of a display is cut.

According to an aspect of the present invention, there is provided an organic light-emitting display apparatus including: a substrate; a display disposed on the substrate; an opposite substrate disposed to face the substrate with the display therebetween; a seal disposed between the substrate and the opposite substrate to couple the substrate to the opposite substrate and is arranged around an outer circumference of the display such that the display is located inside the seal; and a support that is disposed between the substrate and the opposite substrate and is arranged around a corner of the seal so that the corner of the seal is located inside the support.

The support may be disposed in parallel to and spaced apart from a cut line used to cut the substrate and the opposite substrate.

The support may include at least one of a plurality of films that form a thin film transistor included in the display.

The support may include at least one selected from a pixel-defining film, a via film, a source and drain film, an interlayer film, a gate film, a gate electrode film, a gate insulating film, and a buffer film.

The support may be angularly disposed to correspond to the corner of the seal.

The support may contact the substrate and the opposite substrate.

The support may include a pixel-defining film where the support contacts the opposite substrate.

The support may have a polygonal or a circular cross-section.

The support may have a rectangular or a square cross-section.

The support may include a plurality of supports that are spaced apart from each other.

According to another aspect of the present invention, there is provided a method of manufacturing an organic light-emitting display apparatus, the method including: forming a plurality of displays and supports on a mother substrate, wherein each of the supports is located in such a manner that a portion of a seal corresponding to a corner of a corresponding display is located inside the support; forming the seal on an opposite mother substrate around circumferences of the displays in such a way that the displays are located inside the seal; disposing the opposite mother substrate to face the mother substrate with the displays therebetween; melting the seal to couple the mother substrate to the opposite mother substrate; and cutting the mother substrate and the opposite mother substrate by using a cutting instrument.

Forming the support may include disposing the support to be parallel to and spaced apart from a cut line used to cut the mother substrate and the opposite mother substrate.

Forming the support may include forming a film that constitutes a thin film transistor included in the display.

Forming the support may include forming at least one selected from a pixel-defining film, a via film, a source and drain film, an interlayer film, a gate film, a gate electrode film, a gate insulating film, and a buffer film.

Forming the support may include forming a pixel-defining film on a top end portion of the support.

In forming the support, a height of the support may be less than or equal to a height of the seal.

In the forming the support, the support may be angularly disposed with respect to a corner of the seal.

Forming the support may include forming a plurality of supports that are spaced apart from each other.

In melting the seal, a height of the seal may be decreased to contact the support formed on the opposite mother substrate with the mother substrate.

The melting of the seal may include melting by irradiation of lasers.

BRIEF DESCRIPTION OF THE DRAWINGS

The above and other features and advantages of the present invention will become more apparent by describing certain embodiments thereof with reference to the attached drawings in which.

DETAILED DESCRIPTION OF CERTAIN INVENTIVE EMBODIMENTS

Expressions such as "at least one of," when preceding a list of elements, modify the entire list of elements and do not modify the individual elements of the list.

Hereinafter, the construction and operation of the present invention are described below in detail with reference to certain embodiments illustrated in the attached drawings.

An organic light-emitting display apparatus includes a display panel that can be produced in great quantity by cutting a mother substrate on which a plurality of display units are arranged, and an opposite mother substrate. Prior to the cutting of the mother substrate and the opposite mother substrate, the mother substrate and the opposite mother substrate need to be coupled to each other, and during the coupling, a seal is generally used.

However, typically, at a corner of the display unit, the seal may have a round shape, or a curved shape and thus, a pressure applied thereto by a cutting instrument is not sufficiently maintained, and thus is not uniform. As a result, an intermediate crack depth is not sufficiently deep during the cutting, and cutting may not be smoothly performed, thereby forming a non-uniform cut surface, that is, causing cracks and burrs. Even when the curved portion of the seal is reduced, unless the curved portion is angulated, the seal may not sufficiently support and a non-uniform cut surface may be formed.

The non-uniformity of the cut surface may be prevented by forming a dummy seal on a pad portion. This method, however, may cause a height deviation among seals because the seal is not hardened, and due to the height deviation, a step may occur during the cutting, and thus, exfoliation and cutting defects may occur.

Accordingly, there is a need to improve exfoliation and cutting defects which occur due to a step of the seal occurring when a corner of a display unit is cut.

Figure 1:
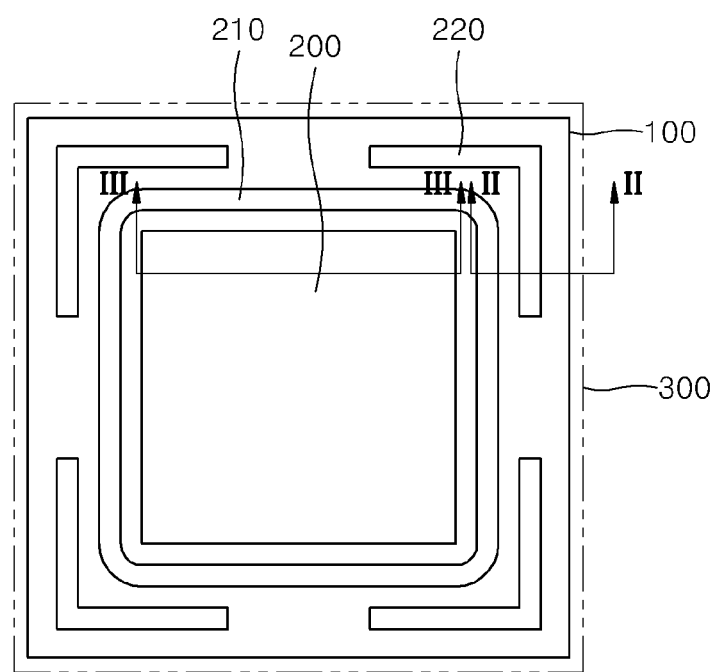
FIG. 1 is a schematic plan view of an organic light-emitting display apparatus according to an embodiment of the present invention.

FIG. 1 is a schematic plan view of an organic light-emitting display apparatus according to an embodiment of the present invention. An opposite substrate 300 is located above a substrate 100, a seal 210, and a support 220. For convenience, the substrate 100, the seal 210, and the support 220 are illustrated in solid line.

Referring to FIG. 1, an embodiment of the organic light-emitting display apparatus includes the substrate 100, a display unit 200 on the substrate 100, the opposite substrate 300 that is arranged to face the substrate 100 with the display unit 200 therebetween. The apparatus also include the seal 210 disposed between the substrate 100 and the opposite substrate 300 to couple the substrate 100 to the opposite substrate 300 and arranged around an outer circumference of the display unit 200 such that the display unit 200 is located inside the seal 210. The apparatus also includes the support 220 disposed between the substrate 100 and the opposite substrate 300 and arranged around a corner of the seal 210 so that the corner of the seal 210 is located inside the support 220.

The display unit 200 is disposed on the substrate 100. The opposite substrate 300 may be arranged to face the substrate 100 with the display unit 200 therebetween.

Outside the display unit 200, the seal 210 is disposed around the outer circumference of the display unit 200. The seal 210 may be formed of a material that may couple the substrate 100 to the opposite substrate 300. For example, the seal 210 may be formed of glass frit. In the case of glass frit, due to its high hardness, the substrate 100 may be strongly coupled to the opposite substrate 300, and in particular, a misalignment of a mother substrate and an opposite mother substrate due to an external force applied by a cutting instrument when the mother substrate and the opposite mother substrate are cut may be prevented so that the mother substrate is strongly attached to the opposite mother substrate.

Outside the seal 210, the support 220 is arranged around a corner of the seal 210. The support 220 is disposed between the substrate 100 and the opposite substrate 300 and supports a pressure applied by a cutting instrument when the substrate 100 and the opposite substrate 300 are cut.

A portion of the seal 210, which is formed around the corner of the display unit 200, may have a round shape or a curved shape. Accordingly, a pressure applied thereto by a cutting instrument when the substrate 100 and the opposite substrate 300 are cut is not sufficiently supported by the seal 210. As a result, a pressure applied to the substrate 100 and the opposite substrate 300 by the cutting instrument is not uniform, and an intermediate crack in the substrate 100 and the opposite substrate 300 may not be sufficiently deep. Accordingly, the cutting may not be performed smoothly, and the cut surface may be non-uniform. However, since the support 220 is arranged around the corner of the seal 210, the support 220 improves a step of the seal 210 at the corner and supports a pressure applied during the cutting. That is, the support 220 may support a stress caused by the pressure applied by the cutting instrument when the substrate 100 and the opposite substrate 300 are cut, and may minimize a stress due to the seal 210, so that an intermediate crack is formed with an appropriate depth and a uniform cut surface is formed.

The support 220 may be disposed parallel to and spaced apart from a cut line. The support 220 and the cut line may not be on the same line. When the support 220 and the cut line are on the same line, the support 220 may easily support the pressure applied to the cut line. In this case, however, the support 220 is cut together, and thus, a pressure applied to the cut line increases and thus, cutting may not be smoothly performed and the cut surface may be non-uniform. Accordingly, the support 220 may be disposed spaced apart from the cut line. In addition, the support 220 may be disposed parallel to the cut line to maintain the pressure applied to the cut line at a constant level. That is, the support 220 supports a surrounding of the corner of the seal 210, while being separated from the cut line in parallel. Accordingly, cracks and burrs which may occur during the cutting may be prevented.

The support 220 may include at least one of a plurality of films that constitute a thin film transistor of the display unit 200.

If a support is formed of a sealant, when a mother substrate is coupled to an opposite mother substrate by melting a sealant, the support also melts, and thus, the pressure applied by a cutting instrument may not be supported by the support. For example, even when a laser is irradiated to only the sealant so as not to melt the support, a portion of the sealant disposed near the corner of a display unit is not sufficiently melted, and thus, when the mother substrate and the opposite mother substrate are cut, a high stress may be applied to the opposite mother substrate, thereby causing exfoliation and cutting defects. In addition, if the support is formed of a sealant, this is an additional process for disposing the sealant in a region other than a seal region, thereby making the manufacturing process complicated and causing additional costs. Accordingly, the support 220 may be disposed on the substrate 100 by using a material that is not the sealant, without an additional process. The support 220 may be formed by disposing a film that constitutes a thin film transistor included in the display unit 200 by using a process of manufacturing the thin film transistor. In this case, the support 220 needs to be formed not including an align key and a signal line.

For example, the support 220 may include at least one selected from a pixel-defining film, a via film, a source and drain film, an interlayer film, a gate film, a gate insulating film, and a buffer film, which are included in a display unit, or may have a structure formed by sequentially stacking a buffer film, a gate film, a gate insulating film, an interlayer film, a source and drain film, a via film, and a pixel-defining film. Alternatively, at least one film may be removed from the stack structures to form the support 220.

The support 220 may be angularly formed to correspond to the corner of the seal 210. The support 220 may supplement insufficient supporting of the pressure during the cutting, wherein the insufficient supporting occurs because the seal 210 at the corner of the display unit 200 has a round shape or a curved shape. Accordingly, the support 220 may be disposed to correspond to the corner of the display unit 200 in which the pressure during the cutting is not sufficiently supported because the seal 210 has with a round shape or a curved shape. In addition, the support 220 may have an angular form to compensate for the round or curved shape of the seal 210 and to sufficiently exert its support to the corner of the display unit 200.

A cross-section of the support 220 may be polygonal or circular. A height of the support 220 may be determined according to a height of the adjacent seal 210, and a width of the support 220 may be determined according to a size of the stress which is withstood by the support 220 during the cutting and a cutting process margin. If these conditions are satisfied, the cross-sectional shape of the support 220 may be determined, and may be polygonal or circular. For example, the cross-section of the support 220 may be square, rectangular, oval, diamond-shaped, trapezoidal, or circular. For example, the support 220 may have an H-shape or a bar (-) shape. In addition, the support 220 may have a polygonal or circular shape having a pore.

Figure 2:
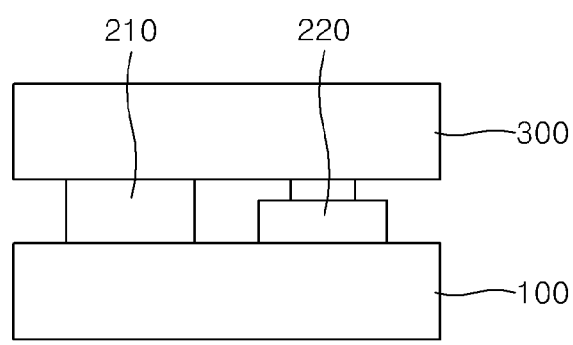
FIG. 2 is a cross-sectional view taken along line II-II of FIG. 1.

FIG. 2 is a cross-sectional view taken along line II-II of FIG. 1.

Referring to FIG. 2, the seal 210 and the support 220 are disposed between the substrate 100 and the opposite substrate 300. Although not illustrated, the seal 210 may be arranged around an outer circumference of the display unit 200 at the corner of the display unit 200, and the support 220 may be disposed with the seal 210 within the support 220.

At the corner of the display unit 200, the seal 210 may not sufficiently support a pressure applied to the mother substrate and the opposite mother substrate by a cutting instrument during the cutting.

The seal 210 in a melted state may contact the substrate 100 and the opposite substrate 300, thereby coupling the substrate 100 to the opposite substrate 300. The seal 210 may be formed of a material that has a relatively high hardness, and may strongly fix the substrate 100 and the opposite substrate 300 to prevent a misalignment of the substrate 100 and the opposite substrate 300 caused by an external force applied thereto during when the mother substrate and the opposite mother substrate are cut. However, since a portion of the seal 210 corresponding to the corner of the display unit 200 has a round shape or a curved shape, an external force applied during the cutting is not sufficiently supported. Accordingly, the support 220 is disposed outside the seal 210, and thus, during the cutting, supports the mother substrate 100 and the opposite mother substrate 300.

During the cutting, the support 220 contacts the mother substrate 100 and the opposite mother substrate 300 and sufficiently supports an external force applied to the mother substrate 100 and the opposite mother substrate 300. That is, during the cutting, a height of the support 220 may be identical to a height of the seal 210. After the cutting is completed, the support 220 may contact the substrate 100 and the opposite substrate 300.

The support 220 may be formed by using at least one of a plurality of films that constitute a thin film transistor included in the display unit 200. By doing so, without an additional process for forming the support 220, the display unit 200 and the support 220 may be formed at the same time. In particular, a pixel-defining film may be arranged on a top end portion of the support 220 which contacts the opposite substrate 300. Since a pixel-defining film is formed of polyimide, even when the seal 210 melts and a height thereof is reduced, a step change may be appropriately compensated for.

Figure 3:
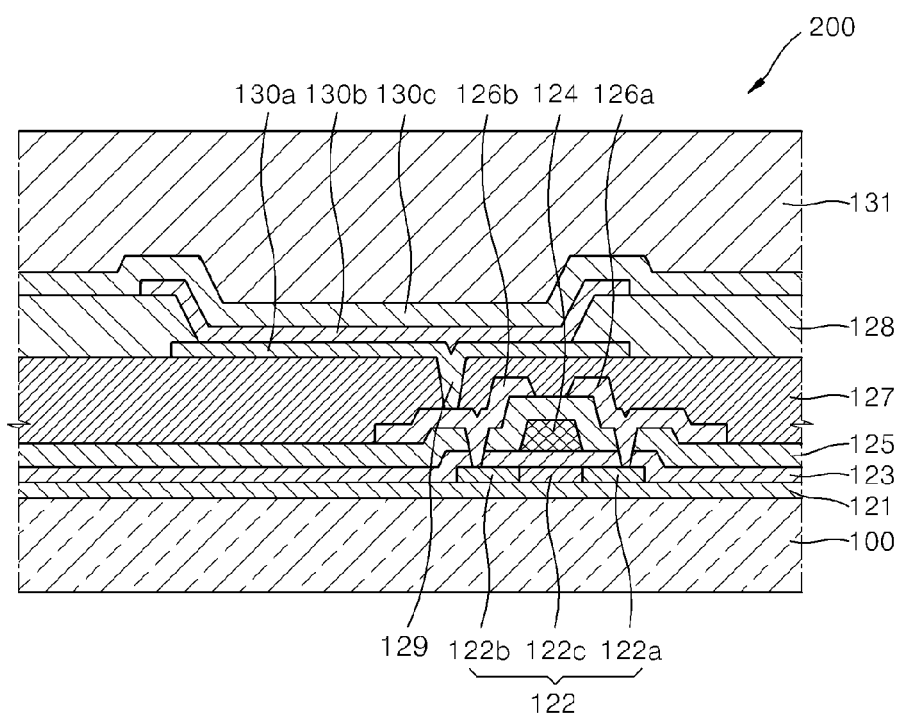
FIG. 3 is a cross-sectional view taken along line of FIG. 1.

FIG. 3 is a cross-sectional view taken along line of FIG. 1.

In detail, FIG. 3 illustrates a cross-sectional view of an emission region of an organic light-emitting display apparatus. The emission region includes a thin film transistor (TFT) and an organic emission device that is driven by the TFT and embodies an image. The TFT includes a buffer film 121, a gate insulating film 123, an interlayer film 125, and a planarization film 127, and the organic emission device includes a pixel electrode 130*a*, an organic light-emitting film 130*b*, and an opposite electrode 130*c*. An embodiment of the organic light-emitting display apparatus is described below.

The substrate 100 may be formed of a transparent glass material including $SiO_2$. A material for forming the substrate 100 is not limited thereto, and may also be a transparent plastic material. The transparent plastic material may be an insulating organic material, and may be, for example, polyethersulphone (PES), polyacrylate (PAR), polyetherimide (PEI), polyethylene naphthalate (PEN), polyethyelene-terepthalate (PET), polyphenylene sulfide (PPS), polyallylate, polyimide, polycarbonate (PC), cellulose tri acetate (TAC), or cellulose acetate propionate (CAP). Also, the substrate 100 may be formed of metal.

The buffer film 121 is formed on an upper surface of the substrate 100 to prevent diffusion of impurities, such as an alkali ion, that permeated from the substrate 100, to prevent permeation of water molecules or an external gas, and to planarize a surface of the substrate 100. The buffer film 121 may be formed of, for example, silicon oxide (SiOx).

An active layer 122 and the gate insulating film 123 may be formed on the buffer film 121.

The active layer 122 may be formed of a semiconductor material, for example, an inorganic semiconductor, such as amorphous silicon or polysilicon, or an organic semiconductor. The active layer 122 includes a source region 122*a*, a drain region 122*b*, and a channel region 122*c* interposed between the source region 122*a* and the drain region 122*b*.

The gate insulating film 123 is a film for insulating a gate electrode 124 from the active layer 122, and may be formed of silicon oxide (SiOx), which is also used to form the buffer film 121.

The gate electrode 124 is formed on the gate insulating film 123, and the interlayer film 125 is formed to cover the gate insulating film 123. The interlayer film 125 is a film for distinguishing films that constitute the TFT. The gate electrode 124 is used as a term of gate electrode film.

A source electrode 126*a* and a drain electrode 126*b* are disposed on the interlayer film 125, and the planarization film 127 and a pixel-defining film 128 are sequentially disposed thereon.

The buffer film 121, the gate insulating film 123, the interlayer film 125, the planarization film 127, and the pixel-defining film 128 may be formed of an insulating material, and these layers may have a single-layered structure or a multi-layered structure. In addition, these layers may include an organic material, an inorganic material, or a composite material including an organic material and an inorganic material.

A stack structure of the TFT is not limited thereto, and the TFT may also have various other structures.

The pixel electrode 130a of the organic emission device is formed on the planarization film 127, and the pixel-defining film 128 is formed thereon. An opening is formed in the pixel-defining film 128 to partially expose the pixel electrode 130a and then form the organic light-emitting film 130b of the organic emission device.

The organic emission device emits red light, green light, and blue light according to current to display image information, and may include the pixel electrode 130a, the opposite electrode 130c disposed opposite to the pixel electrode 130a, and the organic light-emitting film 130b that is interposed between the pixel electrode 130a and the opposite electrode 130c to emit light. The pixel electrode 130a is connected to any one of the source electrode 122a and the drain electrode 122b through a via-hole 129 in a circuit region.

The organic light-emitting film 130b may be a low molecular weight organic film or a polymer organic film. The organic light-emitting film 130b may include a hole injection layer (HIL), a hole transport layer (HTL), an emission layer (EML), an electron transport layer (ETL), and an electron injection layer (EIL), each of which may have a single-layered structure or a multi-layered structure. These organic films may be formed by vacuum deposition, and the HIL, the HTL, the ETL, and the EIL are common layers that are shared by red, green, and blue pixels.

The pixel electrode 130a functions as an anode, and the opposite electrode 130c functions as a cathode, and alternatively, the pixel electrode 130a may function as a cathode and the opposite electrode 130c may function as an anode. If the organic light-emitting display apparatus is a bottom emission type display apparatus in which an image is embodied toward the substrate 100, the pixel electrode 130a is a transparent electrode and the opposite electrode 130c is a reflective electrode. If the organic light-emitting display apparatus is a top emission type display apparatus in which an image is embodied toward the opposite substrate 300, the pixel electrode 130a may be a reflective electrode and the opposite electrode 130c may be a transparent electrode. If the organic light-emitting display apparatus is both a bottom and top emission type display apparatus, the pixel electrode 130a and the opposite electrode 130c may both be transparent electrodes.

A passivation film 131 may be further formed on an upper surface of the opposite electrode 130c to cover the organic emission device. The passivation film 131 may include an inorganic material, an organic material, or an organic and inorganic stack structure.

FIGS. 4A to 4F are schematic cross-sectional views illustrating a method of manufacturing an organic light-emitting display apparatus, according to an embodiment of the present invention.

One embodiment of the method of manufacturing an organic light-emitting display apparatus includes: forming a plurality of display units 200 and supports 220 on the mother substrate 100, wherein portions of the seal 210 corresponding to corners of corresponding display units 200 are located inside the supports 220; forming the seal 210 on the opposite mother substrate 300 around circumferences of corresponding display units 200 in such a way that the display units 200 are located inside the seal 210; arranging the opposite mother substrate 300 to face the mother substrate 100 in such a way that the display units 200 are located therebetween; and melting the seal 210 to contact the mother substrate 100 with the opposite mother substrate 300; and cutting the mother substrate 100 and the opposite mother substrate 300 by using a cutting instrument.

Figure 4A:
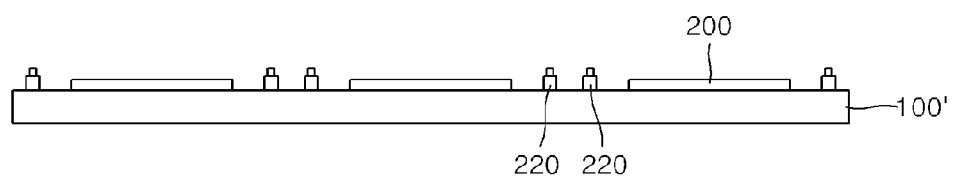
FIGS. 4A to 4F are schematic cross-sectional views illustrating a method of manufacturing an organic light-emitting display apparatus, according to an embodiment of the present invention.
Figure 4B:
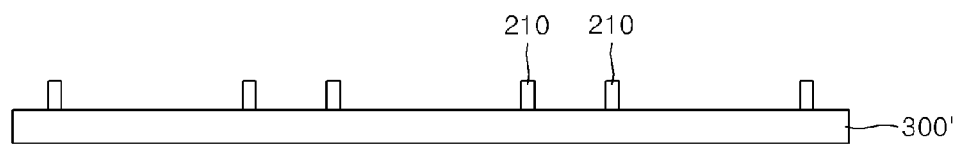

Referring to FIGS. 4A and 4B, first, the display units 200 and the supports 220 are formed on the mother substrate 100.

The mother substrate 100 may be formed of a transparent plastic material that includes $SiO_2$, or a transparent plastic material. The display unit 200 includes a TFT and an organic emission device, each of which is formed by stacking constituting films.

The support 220 is formed on the mother substrate 100 in such a manner that when the mother substrate 100 is coupled to the opposite mother substrate 300, the corner of the seal 210 is located inside the support 220. The support 220 may be formed using a film that constitutes the TFT included in the display unit 200. For example, the support 220 may be formed by stacking at least one film selected from a pixel-defining film, a via film, a source and drain film, an interlayer film, a gate film, a gate electrode film, a gate insulating film, and a buffer film of the display unit 200. The pixel-defining film, the via film, the source and drain film, the interlayer film, the gate film, the gate electrode film, the gate insulating film, and the buffer film of the support 220 may respectively correspond to a pixel-defining film, a via film, a source and drain electrode, an interlayer film, a gate electrode, a gate insulating film, and a buffer film of the display unit 200, and the pixel-defining film, the via film, the source and drain film, the interlayer film, the gate film, the gate insulating film, and the buffer film of the support 220 may be formed using the same methods as those used to form a pixel-defining film, a via hole, a source and drain electrode, an interlayer film, a gate electrode, a gate insulating film, and a buffer film of the display unit 200. Forming the support 220 and forming the display unit 200 may be performed simultaneously.

Then, the seal 210 is formed on the opposite mother substrate 300 around circumferences of display units 200 in such a way that the display units 200 are located inside the seal 210.

That is, the location of the seal 210 formed on the opposite mother substrate 300 may be a location that enables the display unit 200 to be arranged inside the seal 210 when the mother substrate 100 contacts the opposite mother substrate 300. That is, the location of the seal 210 is around outer circumferences of the display units 200 on the opposite substrate 300. The seal 210 may be formed of an inorganic material, such as glass frit.

The portion of the seal 210 which corresponds to a corner of the display unit 200 is formed with a round shape or a curved shape. Accordingly, during the cutting, the portion of the seal 210 may not sufficiently support a pressure applied by a cutting instrument. Accordingly, the support 220 is angularly arranged with respect to the portion of the seal 210, and supports the pressure applied to the corner portion by the cutting instrument.

The support 220 may be arranged in parallel to, and spaced from, a cut line. By doing so, during the cutting, the support 220 is not also cut, and a pressure applied to the cut line may be maintained at a certain level.

A height of the support 220 may be less than or equal to that of the seal 210. When the mother substrate 100 contacts the opposite mother substrate 300, a laser is irradiated to the seal 210 to melt the seal 210, and thus, a height thereof reduces, and the height of the support 220 and the height of the seal 210 may become the same. Accordingly, the height of the support 220 may be less than or equal to that of the seal 210.

Forming the display unit 200 and the support 220 on the mother substrate 100 may be performed prior to, after, or simultaneous to forming the seal 210 on the opposite mother substrate 300.

Figure 4C:
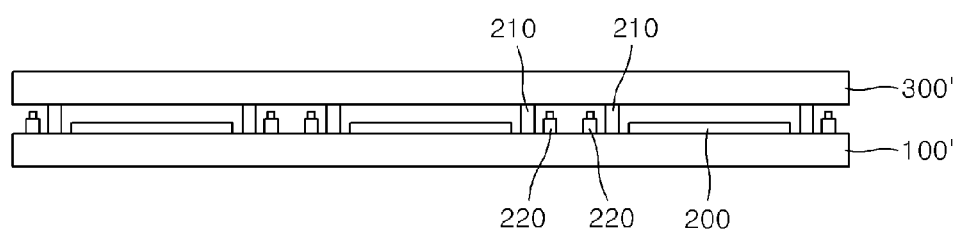

Referring to FIG. 4C, the opposite mother substrate 300 is arranged to face the substrate 100 with the display units 200 located therebetween. The seal 210 and the support 220 are interposed between the mother substrate 100 and the opposite mother substrate 300, and in particular, the seal 210 is arranged around an outer circumference of the display unit 200, and the support 220 is arranged around the corner of the seal 210.

Figure 4D:
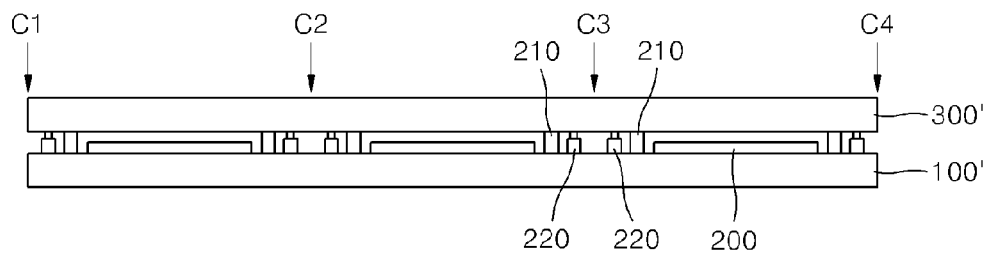

Referring to FIG. 4D, the seal 210 is melted to contact the mother substrate 100 with the opposite mother substrate 300. The melting of the seal 210 may be performed by, for example, irradiation of lasers. When the seal 210 melts, a height thereof decreases and the support 220 and the opposite substrate 300 formed on the mother substrate 100 are coupled to each other.

Figure 4E:
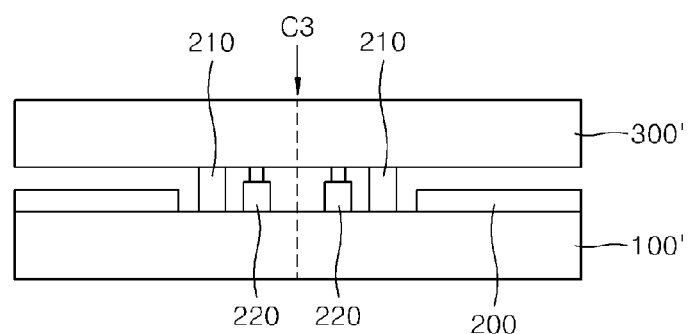

Referring to FIG. 4E, the substrate 100 and the opposite substrate 300 are cut by using a cutting instrument. In detail, the substrate 100 and the opposite substrate 300 are cut along a cut line that is in parallel to, and is spaced apart from, the support 220 by using a cutting instrument, thereby obtaining the substrate 100 and the opposite substrate 300 and completing the manufacturing of an organic light-emitting display apparatus.

Figure 4F:
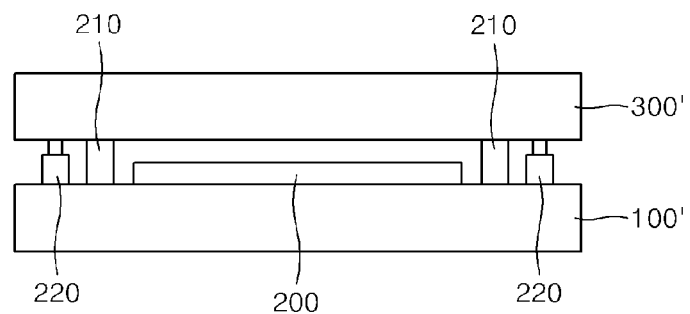

FIG. 4F is a schematic cross-sectional view of an organic light-emitting display apparatus manufactured by using the processes illustrated in FIGS. 4A to 4E. The organic light-emitting display apparatus includes the substrate 100, the display unit 200, the opposite substrate 300, the seal 210 that couples the substrate 100 to the opposite substrate 300 and is disposed around an outer circumference of the display unit 200, and the support 220 that supports the substrate 100 and the opposite substrate 300 and is disposed around the corners of the seal 210.

Figure 5:
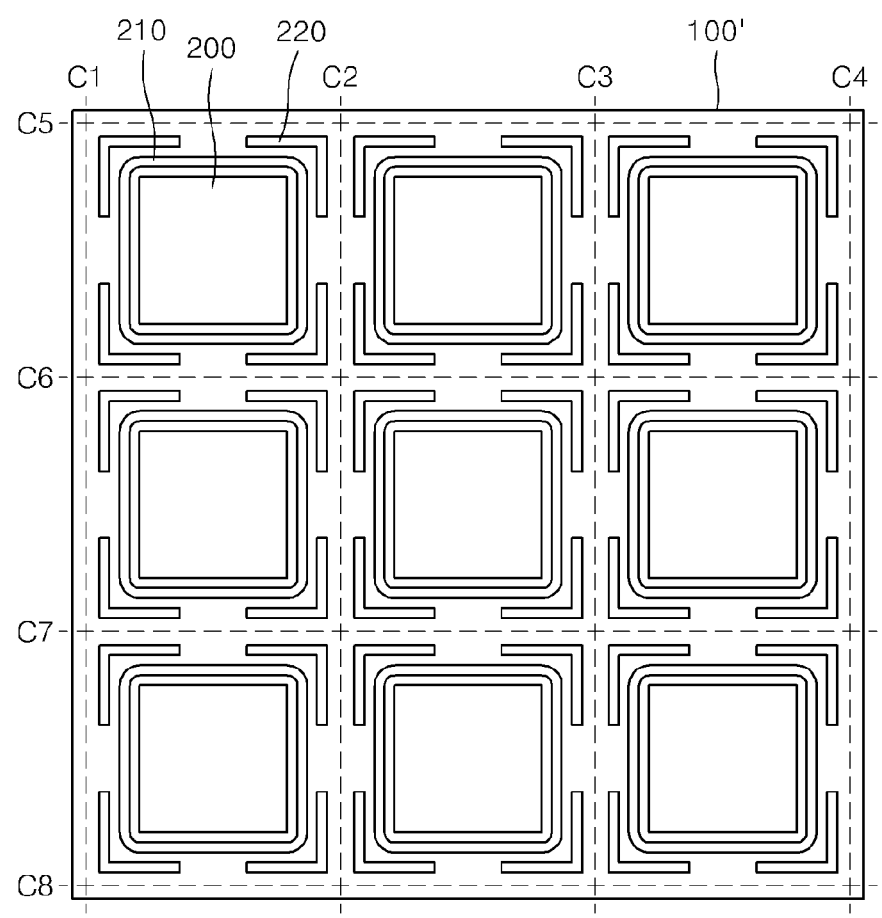
FIG. 5 is a schematic cross-sectional view illustrating a mother substrate and an opposite mother substrate which are coupled to each other by using processes described with reference to FIGS. 4A and 4D.

FIG. 5 is a schematic plane view of the mother substrate 100 and the opposite mother substrate 300 which are coupled to each other through the processes illustrated in FIGS. 4A to 4D. Although the opposite mother substrate 300 is included, the opposite mother substrate 300 is not illustrated for ease of description, and the mother substrate 100, the seal 210, and the support 220 are illustrated as a solid line.

Referring to FIG. 5, the display units 200 are disposed on the mother substrate 100, the seal 210 is arranged around circumferences of the display units 200 in such a way that the display units 200 are located inside the seal 210, and the support 220 is arranged around a corner of the seal 210 in such a way that the corner of the seal 210 is located inside the support 220.

C1 to C8 indicate cut lines, and these cut lines are parallel to, and are spaced apart from, the support 220.

Regarding the mother substrate 100 and the opposite mother substrate 300, during the cutting by using a cutting instrument, due to the support 220 disposed around the corners of the seal 210, a step of the seal 210 is improved at the corners thereof and a pressure applied by the cutting instrument is supported. Thus, an organic light-emitting display apparatus including a display panel having a uniform cut line may be obtained in great quantity.

Figure 6:
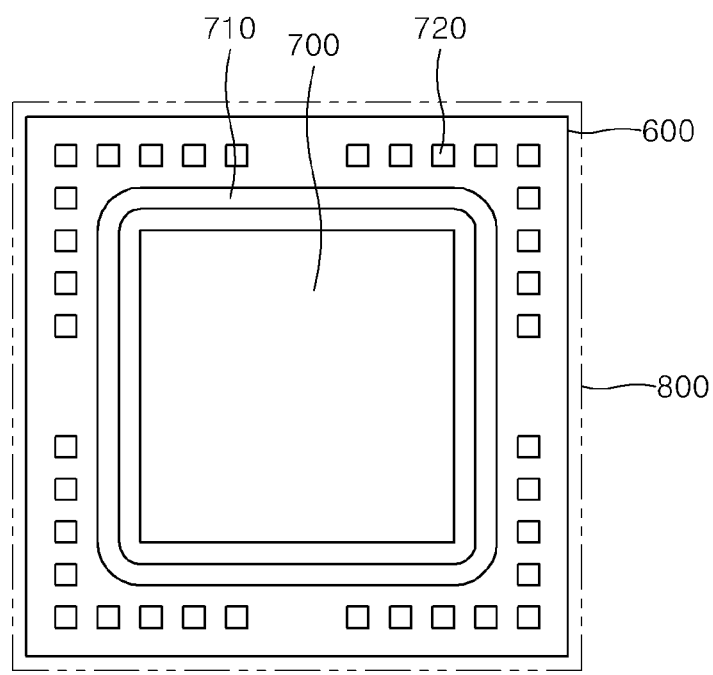
FIG. 6 is a schematic plan view of an organic light-emitting display apparatus according to another embodiment of the present invention.

FIG. 6 is a schematic plan view of an organic light-emitting display apparatus according to another embodiment of the present invention. For ease of description, the difference between the organic light-emitting display apparatus according to the present embodiment and the organic light-emitting display apparatus according to the previous embodiment is described in detail below.

Referring to FIG. 6, the organic light-emitting display apparatus according to the present embodiment includes a substrate 600, a display unit 700 located on the substrate 600, an opposite substrate 800 that is arranged to face the substrate 600 such that the display unit 700 is located therebetween, a seal 710 that is disposed between the substrate 600 and the opposite substrate 800 to couple the substrate 600 to the opposite substrate 800 and is arranged around an outer circumference of the display unit 700 such that the display unit 700 is located inside the seal 710, and a support 720 that is disposed between the substrate 600 and the opposite substrate 800 and is arranged around a corner of the seal 710 so that the corner of the seal 710 is located inside the support 720. In this regard, the support 720 includes a plurality of supports that are spaced apart from each other.

When the support 720 includes a plurality of supports that are spaced apart from each other, a height change or difference of the seal 710 may be easily endured compared to when supports are not spaced apart, and the opposite substrate 800 is flexibly supported and evenly sustained.

The supports 720 may be the same as one another. For example, the supports may have the same height.

In manufacturing the organic light-emitting display apparatus according to the present embodiment, the support 720 may be formed by forming a plurality of supports on the substrate 600 that are spaced apart from each other.

As described above, organic light-emitting display apparatuses according to the above embodiments of the present invention may improve a step of a seal to prevent exfoliation and cutting defects which may occur when a corner of a display unit is cut.

An organic light-emitting display apparatus according to an embodiment of the present invention provides the following effects:

A portion of a seal corresponding to a corner of a display unit is improved to support a pressure applied during the cutting, thereby improving uniformity of cutting.

Cutting conditions, such as a pressure applied during the cutting, are easily set, and thus, cutting defects may be reduced.

A support is formed by using a film that constitutes a TFT included in a display unit, and thus, an additional mask process is not used and an additional cost is not incurred.

While the present invention has been particularly shown and described with reference to certain embodiments thereof, it will be understood by those of ordinary skill in the art that various changes in form and details may be made therein without departing from the spirit and scope of the present invention as defined by the following claims.

What is claimed is:

1. An organic light-emitting display apparatus comprising:
a substrate;
a display disposed on the substrate;
an opposite substrate disposed to face the substrate with the display therebetween;
a seal disposed between the substrate and the opposite substrate to couple the substrate to the opposite substrate and arranged around an outer circumference of the display such that the display is located inside the seal; and
a support disposed between the substrate and the opposite substrate and arranged around a corner of the seal so that the corner of the seal is located inside the support,
wherein the support has a polygonal or a circular cross-section.

2. The organic light-emitting display apparatus of claim 1, wherein the support comprises at least one of a plurality of films that form a thin film transistor comprised in the display unit.

3. The organic light-emitting display apparatus of claim 1, wherein the support comprises at least one selected from a pixel-defining film, a via film, a source and drain film, an interlayer film, a gate film, a gate electrode film, a gate insulating film, and a buffer film.

4. The organic light-emitting display apparatus of claim 1, wherein the support is angularly disposed to correspond to the corner of the seal.

5. The organic light-emitting display apparatus of claim 1, wherein the support contacts the substrate and the opposite substrate.

6. The organic light-emitting display apparatus of claim 5, wherein the support comprises a pixel-defining film where the support contacts the opposite substrate.

7. The organic light-emitting display apparatus of claim 1, wherein the support has a rectangular or a square cross-section.

8. The organic light-emitting display apparatus of claim 1, wherein the support comprises a plurality of supports that are spaced apart from each other.

9. The organic light-emitting display apparatus of claim 1, wherein the support is disposed in parallel to, and spaced apart, from a cut line used to cut the substrate and the opposite substrate.

10. A method of manufacturing the organic light-emitting display apparatus according to claim 1, the method comprising:
    forming a plurality of displays and supports on a mother substrate, wherein each of the supports is located in such a manner that a portion of the seal corresponding to the corner of a corresponding display unit is located inside the support;
    forming the seal on an opposite mother substrate around circumferences of the displays in such a way that the displays are located inside the seal;
    disposing the opposite mother substrate to face the mother substrate with the displays therebetween;
    melting the seal to couple the mother substrate to the opposite mother substrate; and
    cutting the mother substrate and the opposite mother substrate by using a cutting instrument,
    wherein the support has a polygonal or a circular cross-section.

11. The method of claim 10, wherein the forming supports comprises forming a film that constitutes a thin film transistor comprised in the display.

12. The method of claim 10, wherein the forming supports comprises forming at least one selected from a pixel-defining film, a via film, a source and drain film, an interlayer film, a gate film, a gate electrode film, a gate insulating film, and a buffer film.

13. The method of claim 10, wherein the forming supports comprises forming a pixel-defining film on a top end portion of the respective supports.

14. The method of claim 10, wherein in forming the supports, a height of the respective supports is less than or equal to a height of the seal.

15. The method of claim 10, wherein in forming the supports, the respective supports are angularly disposed with respect to a corner of the seal.

16. The method of claim 10, wherein forming supports comprises forming a plurality of supports that are spaced apart from each other.

17. The method of claim 10, wherein in melting the seal, a height of the seal is decreased to contact the support formed on the opposite mother substrate with the mother substrate.

18. The method of claim 10, wherein melting the seal comprises melting by irradiation of lasers.

19. The method of claim 10, wherein the forming supports comprises disposing the supports to be parallel to and spaced apart from a cut line used to cut the mother substrate and the opposite mother substrate.

* * * * *

UNITED STATES PATENT AND TRADEMARK OFFICE
CERTIFICATE OF CORRECTION

PATENT NO. : 8,847,213 B2  
APPLICATION NO. : 13/649420  
DATED : September 30, 2014  
INVENTOR(S) : Dong-Yoon So et al.

Page 1 of 1

It is certified that error appears in the above-identified patent and that said Letters Patent is hereby corrected as shown below:

On the Title page 1, item 72, line 2, please delete "Yongin (JP);" for inventor Ji-Eun Kim and insert -- Yongin (KR); --, therefor.

Signed and Sealed this  
Sixteenth Day of June, 2015

Michelle K. Lee  
*Director of the United States Patent and Trademark Office*